United States Patent [19]

Nath et al.

[11] 4,423,701

[45] Jan. 3, 1984

[54] GLOW DISCHARGE DEPOSITION APPARATUS INCLUDING A NON-HORIZONTALLY DISPOSED CATHODE

[75] Inventors: Prem Nath, Troy; David A. Gattuso, Pontiac, both of Mich.

[73] Assignee: Energy Conversion Devices, Inc., Troy, Mich.

[21] Appl. No.: 363,256

[22] Filed: Mar. 29, 1982

[51] Int. Cl.$^3$ .................. C23C 13/08; H01L 45/00
[52] U.S. Cl. .................................. 118/715; 118/723; 118/50.1; 357/2
[58] Field of Search .............. 118/50.1, 715, 723; 357/2

[56] References Cited

U.S. PATENT DOCUMENTS 3,485,666  12/1969  Sterling et al. .................. 427/39
4,226,898  10/1980  Oushinsky et al. ............ 430/136 X Primary Examiner—Michael R. Lusignan
Attorney, Agent, or Firm—Marvin S. Siskind

[57] ABSTRACT

An improved glow discharge deposition apparatus for depositing amorphous layers upon at least one substrate, the apparatus including a housing capable of withstanding vacuum pressures, a substrate upon which the amorphous layers are deposited, an r.f. powered cathode adapted to cooperate with the substrate for producing a plasma region in the housing, layer-producing materials adapted to be introduced into the plasma region, and heating elements for warming the substrate to a deposition-effecting temperature. The improvement is provided by an electrically insulated base adapted to support the cathode in a non-horizontal, preferably a vertical, plane and a prop adapted to support the substrate in a plane adjacent and parallel to the non-horizontal plane in which the cathode is supported. The non-horizontal cathode is adapted for use either in a single deposition chamber for depositing a single amorphous layer onto the substrate, or in a machine having a plurality of successive deposition chambers for depositing successive amorphous layers onto the substrate. In either embodiment, opposite planar faces of the cathode may be employed in combination with a pair of substrates, deposed in planes parallel to the plane of the cathode faces, to develop two plasma regions for simultaneously depositing amorphous layer-producing material on each of the substrates. The substrate can be formed either of discrete plates or of a continuous web of material. In the embodiment wherein the substrate is formed of discrete plates, a rotatable arm, associated with each deposition chamber, is adapted to cyclically introduce the substrate into the deposition chamber and expel the substrate from the deposition chamber.

27 Claims, 4 Drawing Figures

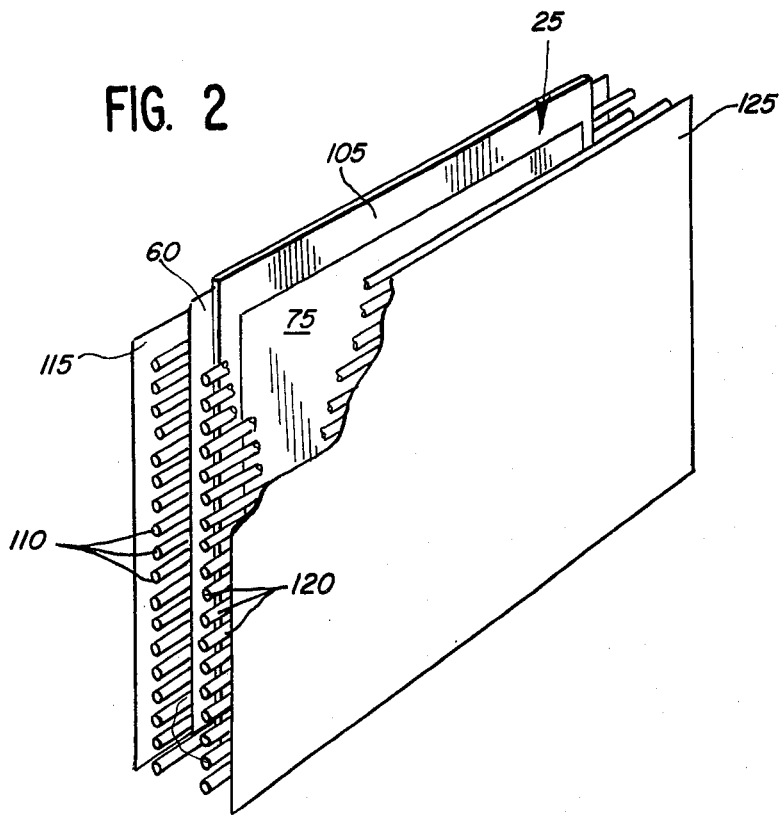
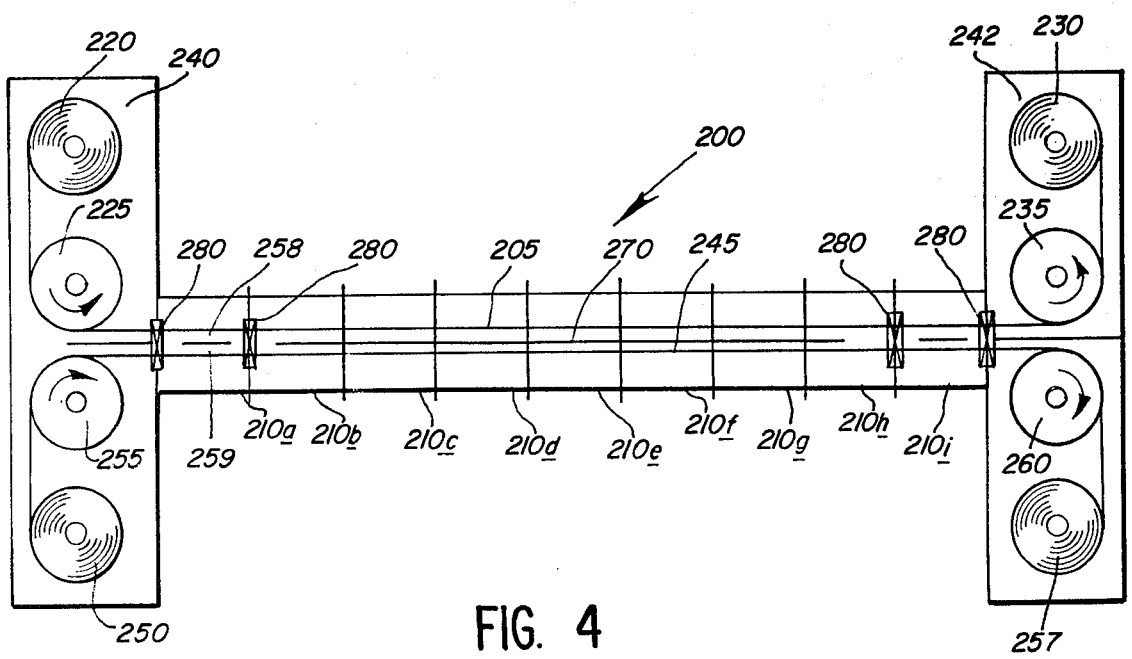

GLOW DISCHARGE DEPOSITION APPARATUS INCLUDING A NON-HORIZONTALLY DISPOSED CATHODE

FIELD OF THE INVENTION

The present invention relates generally to apparatus for producing amorphous layers by a glow discharge deposition process and more particularly, this invention relates to a non-horizontally disposed cathode in the deposition chamber of glow discharge deposition apparatus for depositing amorphous semiconductor layers onto a substrate.

BACKGROUND OF THE INVENTION

This invention deals with improved glow discharge deposition apparatus for producing amorphous semiconductor devices having electronic properties substantially equivalent to those of crystalline semiconductors. Generally, the improvement contemplates moving the normally horizontally disposed cathode of glow discharge deposition apparatus into a non-horizontal plane for increasing the efficiency of deposition. The substrate upon which the amorphous material is adapted to be deposited, is introduced into the deposition chamber in a a plane generally parallel to the plane of the cathode so that a uniform plasma region is developed therebetween. By supporting the cathode in the non-horizontal plane by an edge thereof, one of a pair of substrates may be introduced on each side of the cathode to develop a pair of oppositely disposed plasma regions for simultaneously depositing layers on the pair of substrates.

A considerable effort has been made to develop processes for depositing amorphous semiconductor alloy layers which encompass relatively large areas and which are readily doped to form p-type and n-type materials where p-n junction devices are to be made therefrom equivalent to those produced by their crystalline counterparts. For many years such work was substantially unproductive. Amorphous silicon or germanium (Group IV) films were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did work on "Substitutional Doping of Amorphous Silicon", as reported in a paper published in *Solid State Communications*, Vol. 17, pp. 1193-1196, 1975, toward the end of reducing the localized states in the energy gap in amorphous silicon or germanium to make the same approximate more closely intrinsic crystalline silicon or germanium and of substitutionally doping the amorphous material with suitable classic dopants, as in doping crystalline materials, to make them extrinsic and of p or n conduction types. The reductions of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°-600° K. (227°-327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

Improved amorphous silicon alloys having significantly reduced concentrations of localized states in the energy gaps thereof and of high electronic quality have been prepared with glow discharge decomposition apparatus substantially as described in U.S. Pat. No. 4,226,898, Amorphous Semiconductors Equivalent to Crystalline Semiconductors, Stantfor R. Ovshinsky and Arun Madan which issued Oct. 7, 1980. The apparatus disclosed therein is adapted to introduce amorphous layer-producing materials into a vacuum chamber wherein a plasma region has been developed between a horizontally disposed cathode and an electrode for depositing an amorphous layer upon a generally horizontally disposed substrate. Since one face of the cathode is secured to and rigidified by a backing member, only one face of the cathode can be employed to develop a plasma region. Therefore, only half (one face) of the potential surface area (two faces) of the cathode is utilized. This limits to one the number of substrates on which amorphous layers can be simultaneously deposited.

Further, since both the cathode and substrate are positioned in a substantially horizontal plane, deposition debris falls to a rest position onto the substrate. This is obviously undesirable because of its deleterious effect on the electronic properties of the substrate and the amorphous layers deposited thereon. Deposition debris coming to rest on the cathode, masks part of the surface area thereof, thereby decreasing the available plasma developing surface area of the cathode.

Since the less debris which comes to rest on the cathode, the less frequently it is necessary to dismantle the cathode from its supporting member for cleaning. As the cathode is moved from the horizontal, the amount of debris accumulated thereon decreases to an optimum amount when the cathode is disposed in a substantially vertical plane. Therefore, a non-horizontally disposed cathode requires less down-time for dismantling, cleaning and reassembly.

Further, the thickness of alloy layer deposited on the substrate is partially dependent upon the distance between the cathode and the substrate. Although the distance between the cathode and the substrate is not critical, optimum results are achieved when the distance therebetween is approximately one inch. Every time the cathode is dismantled and reassembled, the distance between the cathode and the substrate may vary slightly, and may not be at the one inch optimum, thereby producing alloy layers of non-uniform thickness.

Glow discharge deposition apparatus are also used in high volume deposition systems to deposit multiple layers of amorphous silicon alloys upon an elongated, continuous web of substrate material by continuously advancing the substrate through a succession of deposition chambers. Since the same type of glow discharge deposition components are used to develop the plasma region in this high volume system, said system suffers from the same undesirable characteristics as discussed hereinabove for the single deposition chamber apparatus.

It is therefore one object of the present invention to provide improved glow discharge deposition apparatus which includes a single deposition chamber, wherein the cathode is supported in a non-horizontal plane to decrease the amount of debris accumulated thereon and to correspondingly increase the operational life thereof.

It is a further object of the present invention to provide improved glow discharge deposition apparatus which includes a single deposition chamber, wherein the cathode is supported adjacent an edge therefor for developing a plasma region adjacent each of its planar faces, whereby an alloy layer may simultaneously be deposited on two substrates.

It is yet another object of the present invention to provide improved glow discharge apparatus which includes a plurality of deposition chambers for depositing successive alloy layers onto a substrate, wherein the cathodes in each deposition chamber are supported in non-horizontal planes to decrease the amount of debris accumulated thereon and to correspondingly increase the operational life thereof.

It is a still further object of the present invention to provide improved glow discharge apparatus which includes a plurality of deposition chambers for depositing successive alloy layers onto a substrate, wherein the cathode in each deposition chamber is supported adjacent an edge thereof for developing a plasma region adjacent each of its planar faces, whereby alloy layers may simultaneously be deposited on two substrates.

It is yet a further objection of the present invention to provide improved glow discharge apparatus, either of the single deposition chamber type or of the multiple deposition chamber type, wherein a mechanism is provided for introducing individual substrates into and/or expelling individual substrates from a deposition chamber.

These and other objects and advantages of the present invention will become clear from the detailed description of the invention; the drawings and the claims.

BRIEF SUMMARY OF THE INVENTION

The present invention is directed to an improved glow discharge apparatus wherein the cathode, or the substrate, or both are supported adjacent their edges in a non-horizontal plane for increasing the operational life and the overall efficiency of the apparatus. Not only does the novel non-horizontal disposition and the edge supporting capability increase the plasma developing surface area of the cathode and the operational life expectancy of the apparatus, but it provides for use of the glow discharge apparatus with two substrates.

The invention is adapted to improve glow discharge apparatus wherein an amorphous layer is deposited upon a substrate. The apparatus, in one embodiment, includes a housing capable of effecting a vacuum, a generally planar cathode powered by an r.f. power generator, a substrate for developing a plasma region in the housing, layer-producing material introduced into the housing between the substrate and cathode, and heating elements for warming the substrate. The improved apparatus includes a prop for supporting the cathode and substrate in a non-horizontal plane. More particularly, the generally planar cathode includes two oppositely disposed, generally planar faces adapted to be removably supported by an electrically insulated base in a substantially vertical plane. Since the cathode is supported at its edge in a substantially vertical plane, the surface area of both faces thereof may be employed to generate plasma regions. In addition, a vertically disposed cathode substantially prevents deposition debris generated in the plasma region from accumulating upon and reducing the efficiency of the cathode. Likewise, with vertically disposed substrates, deposition debris can not collect thereon to interface with the electronic properties of deposited amorphous layers.

In a second preferred embodiment of the present invention the glow discharge deposition apparatus is provided with a plurality of adjacent, operatively connected deposition chambers for depositing successive amorphous layers onto a substrate. Each deposition chamber also includes a cathode, having opposed generally planar faces, an r.f. power generator, at least one substrate, either formed as a continuous web or a plurality of individual plates, layer-producing materials, and heating elements for developing a plasma region between the cathode and each of the at least one substrate. The improvements include (1) the use of an edge supporting prop to support the cathode in a non-horizontal plane, (2) a mechanism for automatically introducing the individual substrate plates into and expelling the individual substrate plates from each deposition chamber, and (3) simultaneously developing a plasma region on both sides of the cathode by employing a substrate adjacent to each face of the cathode.

BRIEF DESCRIPTION OF THE DRAWINGS

FIG. 2 is a partially exploded, perspective view of the non-horizontally disposed cathode flanked on each side by parallel substrates and parallel heating assemblies as disclosed by the present invention;

FIG. 4 illustrates a second preferred embodiment of the present invention and diagrammatically represents a plurality of adjacent glow discharge deposition chambers, each chamber including a non-horizontally disposed cathode and a pair of continuous substrate webs, one web positioned on either side of the cathode.

DETAILED DESCRIPTION OF THE DRAWINGS

Figure 1:
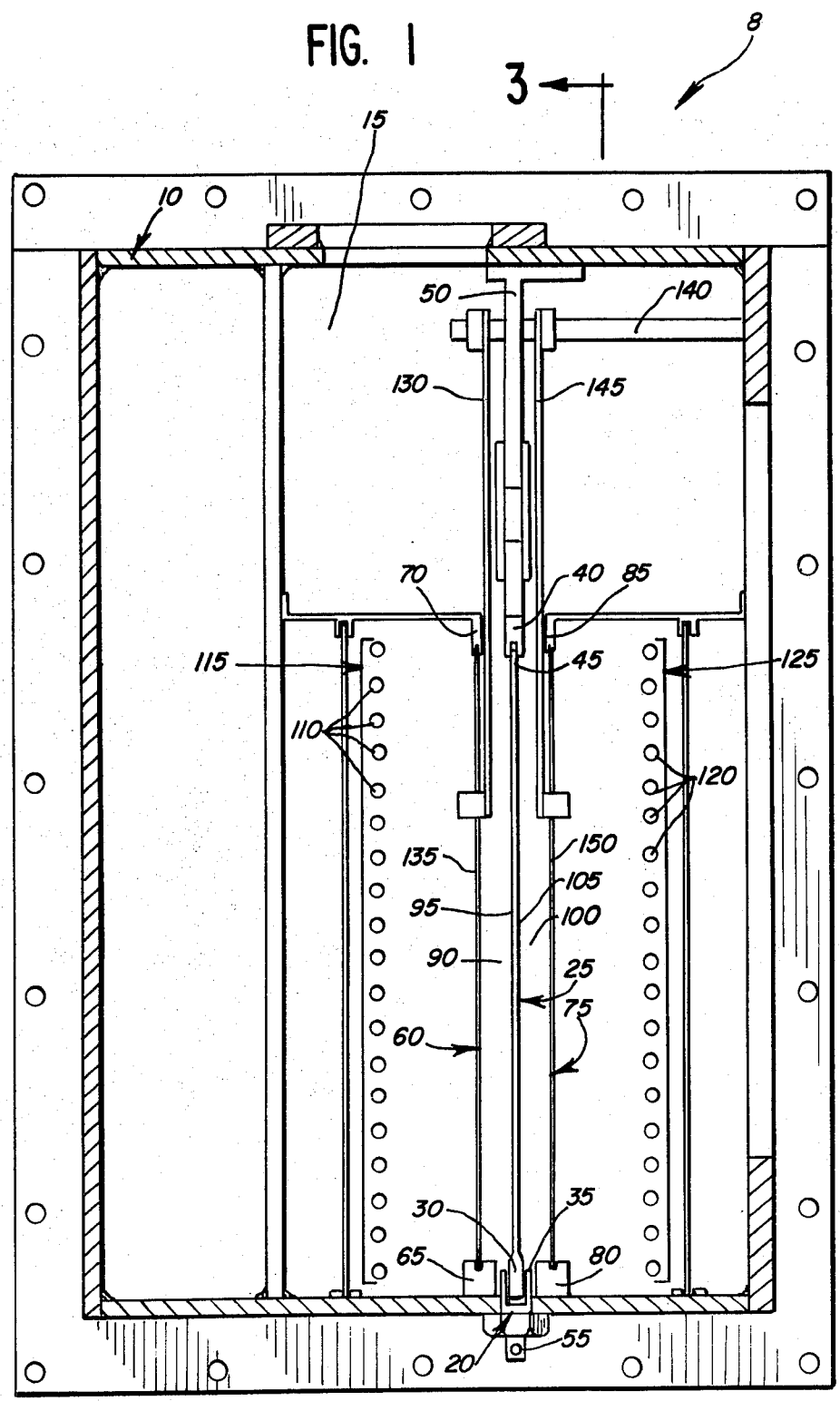
FIG. 1 is a cross-sectional view taken through a glow discharge deposition chamber, such as chamber 210a of FIG. 4, illustrating the non-horizontally disposed cathode and dual substrate arrangement of the present invention.

Turning now to the drawings, FIG. 1 illustrates the glow discharge deposition apparatus, generally 8, of a first preferred embodiment of the present invention. This embodiment includes a housing 10 defining an interior chamber 15 capable of withstanding vacuum pressures of about 5 torr. Secured to the housing 10 is an electrically insulated base 20 for removably supporting a cathode 25 in a substantially vertical plane by retaining the lower edge 30 thereof in a receptacle 35 of U-shaped cross-sectional configuration. An upper edge 45 of the cathode 25 may be supported by an upper cathode-insulating sleeve 40 which, in turn, is secured to the housing 10 by an upper support member 50.

In the preferred embodiment, the glow discharge deposition apparatus 8 illustrated in FIG. 1 is adapted to deposit an amorphous layer on a generally planar substrate 60 supported at its lower end by a lower, channelled, substrate-grounding guide 65 and supported at its upper end by an upper, channelled guide 70 so that the substrate 60 is positioned in a generally vertical plane which is parallel to the plane of the cathode 25. While the present invention positions the cathode 25 and the substrate 60 in substantially vertical planes for optimizing efficiency of the deposition process, the cathode 25 and the substrate 60 may be positioned in any non-horizontal plane by any conventional supporting mechanism and still increase deposition performance over the performance achieved by a cathode and substrate disposed in substantially horizontal planes.

As with most other products, high volume production of amorphous layered substrates is desirable. Production volumes can be increased by utilizing both faces of the generally planar cathode 25. Each face is capable of developing its own plasma region, whereby an amorphous layer is simultaneously deposited on two substrates. Accordingly, a second substrate 75 is introduced into the housing 10 on the side of the cathode 25 opposite the first substrate 60. A lower, channelled, substrate-grounding guide 80 and an upper, channelled guide 85 are adapted to support the second substrate 75 within the housing 10 in a generally vertical plane which is substantially parallel to the plane of the cathode 25.

An external power generating source (not shown) is adapted to be electrically connected to a terminal 55 extending through the bottom of the housing 10 for providing r.f. (radio frequency) power to the cathode 25. Although, the preferred embodiment of the present invention contemplates the use of an r.f. power source, any conventional power source, such as direct current, can be used to develop the plasma regions. In operation, when power is supplied to the cathode 25 through the terminal 55, a first plasma region 90 is developed between surface of the planar face 95 of the cathode 25 and the adjacent surface of the first substrate 60. A second plasma region 100 is simultaneously developed between the surface of a second planar face 105 of the cathode 25 and the surface of the second substrate 75. The plasma regions 90 and 100 may either be considered (1) separate and distinct because each of the oppositely disposed cathode faces 95 and 105 develops a distinct plasma region; or (2) continuous because the single cathode 25 develops both of the plasma regions 90 and 100. In this application, the term plasma region will be understood to encompass both definitions. The cathode 25, the cathode faces 95 and 105, the power source, and the substrates 60 and 75 combine to provide apparatus for developing the plasma regions 90 and 100 within the interior chamber 15 of the housing 10.

The use of cathodes of varying configurations and produced of various materials are all within the scope of the present invention. Although, in the preferred embodiment, the cathode 25 is preferably made of stainless steel, cathodes produced from other materials capable of creating a potential with a grounded electrode can also be employed. Although the cathode 25 has been described as a generally planar member (about ⅛ inch thick) utilizing each of its planar faces 95 and 105 to form the plasma regions 90 and 100, cathodes of varying shapes may also be employed. For instance, a cathode shaped as a triangular prism could be used to develop three plasma regions.

Rod-shaped, resistance-type heating elements, shown collectively as 110, are supported in the housing 10 on one side of and in a plane generally parallel to the plane of the first substrate 60 and the cathode 25. The heat radiated from the heating elements 110 is directed toward the substrate 60 by a generally planar heat-reflective shield 115 which is also supported in a plane generally parallel to the plane of the substrate 60 and the cathode 25. When two substances are employed, a second set of rod-shaped, resistance-type heating elements, shown collectively as 120 are supported on the side of cathode 25 opposite from the heating elements 110 for warming the second substrate 75 and a second generally planar heat-reflective shield 125 is adapted to direct the heat radiated by the heating elements 120 toward the second substrate 75. It should be apparent that other conventional heating elements could be employed to warm the substrates 60 and 75 without departing from the scope of this invention.

The housing 10 is provided with at least one conduit (not shown) for introducing layer-producing material into the plasma regions 90 and 100. When the apparatus is operational and the layer-producing material is introduced into the plasma regions 90 and 100 of the housing 10, an amorphous layer will be simultaneously deposited upon the substrates 60 and 75.

As used herein, the layer-producing material is a carrier medium, usually gas, which delivers elemental constituents to the plasma regions 90 and 100 for disassociation into deposition species for subsequent deposition, as amorphous layers, onto a surface of each of the substrates 60 and 75. Examples of intrinsic elemental constituents used for developing an amorphous layer include silicon tetrafluoride and silane or germanium tetrafluoride and germane. Dopant elemental constituents include diborane and phosphine. However, the foregoing materials are merely exemplary and not intended to restrict the composition of possible layer-producing materials included in the concept of the present invention.

Also depicted in FIG. 1 are a pair of elongated, rotatable, substrate-engaging arms 130 and 145 adapted to rotate with axle 140. Referring first to the arm 130, said arm is adapted to selectively swing down from a normal raised, starting position to a lower, substrate-contacting, operational position wherein it abuts and pushes against the edge 135 of the substrate 60 so as to expel the substrate 60, slidably supported within the channelled lower guide 65 and the channelled upper guide 70, from the plasma region 90 of the housing 10. Further rotation of the arm 130 with the axle 140 completes the explusion of the substrate 60 from the housing 10. The arm 130 is then adapted to return to its starting position wherein it is ready to engage an edge of a new substrate for introducing that new substrate into the plasma region 90 of the housing 10. In a similar manner, the arm 145, located on the side of the cathode 25 opposite the arm 130, is adapted to rotate with the axle 140 to engage the edge 150 of the second substrate 75 for expelling the second substrate 75, slidably supported within the channelled lower guide 80 and the channelled upper guide 85, from the housing 10. Further rotation of the arm 145 completes the expulsion of the substrate 75 after which the arm 145 is adapted to return to its starting position wherein it is ready to engage an edge of a new substrate for introducing that new substrate into the plasma region 100. The arms 130 and 145, the axle 140, the upper guides 70 and 85, the lower guides 65 and 80 and a drive motor (not shown) for rotating the axle 140, combine to cyclically introduce and expel the substrates 60 and 75 into and from the plasma regions 90 and 100, respectively. In this way a new substrate may be moved through the plasma regions 90 and 100 during each deposition cycle. Obviously, other means of moving the substrates through the plasma regions may be employed without departing from the scope of the present invention.

Figure 3:
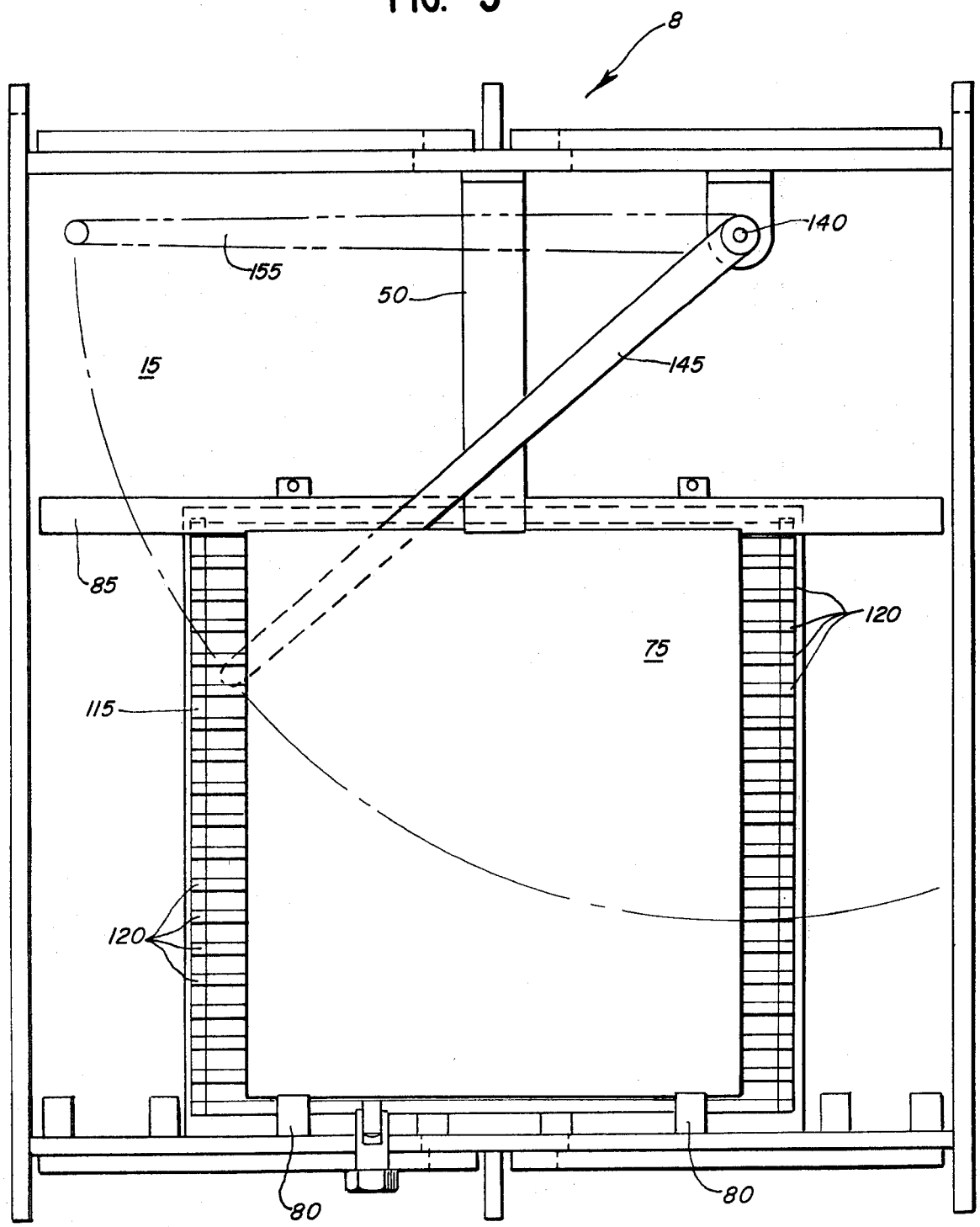
FIG. 3 is a cross-sectional view taken along line 3—3 of FIG. 1, illustrating the operation of the rotatable, substrate-indexing arm adapted for use with the glow discharge deposition apparatus of the present invention.

FIG. 3 better illustrates the manner in which rotation of the arm 145 operates to expel the substrate 75 from the housing 10. Also depicted in FIG. 3 is the raised, generally horizontal, non-operational starting position of the arm 145, show in phantom by the numeral 155. Rotation of the arm 145 in the counterclockwise direction, slides the substrate 75 within the channelled guides 80. When the arm 145 has rotated 180 degrees in the counterclockwise direction, expulsion of the substrate 75 is complete and the arm 145 will rotate 180 degrees in the clockwise direction to return to its starting position 155. This represents one full cycle.

The perspective view of the subassembly shown in FIG. 2 illustrates the spacial relationship between the centrally positioned cathode 25, the substrates 60 and 75, the plasma regions 90 and 100, the heating elements 110 and 120 and the heat reflecting shields 115 and 125. Both of the substrates 60 and 75 are supported in a plane generally parallel to and at an optimum distance of approximately one inch from the plane of the cathode 25 in order to develop the uniform plasma regions 90 and 100, respectively.

Since it is desirable to provide even heat distribution over the substrates 60 and 75 for developing plasma regions 90 and 100 which will deposit uniform amorphous layers onto the substrates 60 and 75, the heating elements 110 and 120 and the heat-reflective shields 115 and 125 will be supported in planes generally parallel to the planes of the substrates 60 and 75. However, it should be apparent that the angular positioning of the planes of the heating elements relative to the planes of the substrates are not critical as long as the heating elements are adapted to supply an even distribution of heat to the substrate.

FIG. 4 illustrates a second preferred embodiment of the present invention, generally represented by the reference number 200, which embodiment is particularly suited for the high volume production of multi-layered amorphous photovoltaic devices. The multiple chamber glow discharge deposition apparatus 200 is adapted to produce a plurality of stacked amorphous layers on a continuous web of substrate material 205. The continuous web of substrate material 205 extends across a plurality of dedicated deposition chambers 210a–210i for depositing successive layers of amorphous material. Although the deposition chambers 210a–201i are preferably arranged along a generally horizontal axis, the chambers may be arranged along a generally vertical axis or in a tiered configuration without departing from the scope of the present invention.

The continuous web of substrate material 205 is adapted to have deposited thereon successive amorphous, semiconductor layers as it moves through the deposition chambers 210a–210i. At the supply end of the chambers, a rotatable pay-out roller 220 is adapted to forward the leading edge of the web of substrate material 205 from a turning roller 255 into the first deposition chamber 210a. At the take-up end of the chambers, a rotatable take-up roller 230 is adapted to collect the web of substrate material 205 from a turning roller 235 after completion of the deposition process. The web of substrate material 205, the pay-out roller 220, the take-up roller 230, the turning rollers 225 and 235 and one or more drive motors (not shown) combine to provide (1) a selectively activated mechanism for moving the web of substrate material 205 through each of the deposition chambers 210a–210i; and (2) at least part of the apparatus adapted to support the web of the substrate material 205 in a substantially vertical plane as it moves through the plasma regions developed in the deposition chambers 210a–210i.

The second preferred embodiment 200 is adapted to simultaneously deposit amorphous layers upon a second web of substrate material 245 disposed on the side of the cathode 270 opposite from the side on which the first web of substrate material 205, described hereinabove, is disposed. To that end the second web of substrate material 245, stored on a supply roller 250 is trained about a turning roller 255 to travel through each of the deposition chambers 210a–210i and is then trained about turning roller 260 to be collected on a take-up roller 257. In this way, opposite faces of a single cathode, such as 270, are adapted to simultaneously develop a first plasma region 258 between one of its faces and the first web of subsgtrate material 205 and a second plasma region 259 between the other of its faces and the second web of substrate material 245.

It should be obvious that the plurality of deposition chambers 210a–210i of the embodiment 200 illustrated in FIG. 4, is alternatively capable of successively depositing amorphous layers onto a plurality of individual substrate plates, such as the substrate plates 60 and 75 of FIG. 2, rather than the continuous web of substrate material 205 and 245. The rotatable arms 130 and 140, depicted in FIG. 1 and described hereinabove, could be easily adapted to move such individual substrate plates from one deposition chamber, such as 210a, to an adjacent deposition chamber, such as 210b.

It is essential that the deposited amorphous layers be of high purity in order to produce semiconductor devices having the required electrical properties. If the layer-producing materials introduced into one of the dopant deposition chambers 210a–210i were permitted to flow into an adjacent deposition chamber, the layer-producing materials in said adjacent deposition chambers would become contaminated and the semiconductor would be rendered inoperative. Accordingly, a gas gate 280 is provided at the entry end and the exit end of deposition chambers 210a–210i (although only illustrated for deposition chambers 210a and 210i). The gas gates 280 include a relatively narrow passageway which cooperates with a vacuum pumping system to establish unidirectional flow of layer-producing materials therethrough. It is also through that passageway that the web of substrate material 205 passes. Obviously, in those instances in which two webs of substrate material 205 and 245 are simultaneously employed, the gas gates 280 are provided with a pair of passageways, one on each side of the cathode 270. Although a complete description of the gas gates 280 is believed to be unnecessary, such gas gates being now well known by persons skilled in the art, for purposes of clarity it should be noted that those deposition chambers having layer-producing material which can not be contaminated are kept at a higher internal pressure than adjacent chambers. The pressure differential between adjacent chambers establishes the unidirectional flow of layer-producing material in the desired direction.

Based upon the foregoing description, it should be apparent that as the plane of the substrate is angulated from the horizontal to a vertical plane, less deposition debris will accumulate thereon to deleteriously affect the electronic properties of the amorphous layers. The operating life of the cathode is likewise increased because the debris from the deposition process does not mask portions of the cathode surface which develop the plasma region. Additionally, the embodiments described hereinabove provide glow discharge deposition apparatus characterized by simplicity of operation, economic efficiency, versatility and reliability.

It should be understood that the present invention is not limited to the precise structure of the illustrated embodiments. It is intended that the foregoing description of the presently preferred embodiments be regarded as an illustration rather than as a limitation of the present invention. It is the following claims, including all equivalents, which are intended to define the scope of this invention.

What we claim for Letters Patent is:

1. In deposition apparatus wherein a semiconductor layer is deposited upon a substrate; the apparatus including a housing; a vacuum chamber provided by said housing; means for developing a plasma region in said vacuum chamber; said plasma region developing means including: a cathode operatively disposed within said chamber; at least one substrate operatively disposed within said chamber; means for introducing an amorphous layer-producing material into said plasma region; a semiconductor layer-producing material; and means for heating said substrate; the improvement comprising, in combination:

means for supporting said cathode in a non-horizontal plane within said housing, whereby the amount of deposition debris collected on the cathode is minimized.

2. An improvement as in claim 1, wherein said cathode is supported in a generally vertical plane.

3. An improvement as in claim 1, wherein said cathode-supporting means includes an electrically insulated base for removably supporting said cathode in a generally vertical plane; and wherein the substrate is supported in a plane generally parallel to the plane of the cathode.

4. An improvement as in claim 3, wherein said plasma region developing means further includes a second substrate for developing a second plasma region; and means for supporting said second substrate in a second plane generally parallel to the plane of said cathode.

5. A deposition apparatus for depositing a semiconductor layer upon a substrate comprising:
 a housing;
 a vacuum chamber provided by said housing;
 a cathode having at least two planar faces operatively disposed within said chamber; an electrically insulated base for removably supporting said cathode in a non-horizontal plane;
 at least one substrate operatively disposed within said chamber; and
 means for developing a plasma region between one of said cathode faces and the substrate; said plasma region developing means including: means for supporting said substrate adjacent said cathode; means for introducing a semiconductor layer-producing material into said plasma region; a semiconductor layer-producing material; and means for heating said at least one substrate, whereby a semiconductor layer will be deposited onto said at least one substrate.

6. In deposition apparatus wherein a semiconductor layer is deposited upon a substrate; the apparatus including a housing; a vacuum chamber provided by said housing; means for developing a plasma region in said vacuum chamber; said plasma region developing means including: a cathode operatively disposed within said chamber; at least one substrate operatively disposed within said chamber; means for supporting said substrate within said plasma region; means for introducing a semiconductor layer into said plasma region; a semiconductor layer-producing means; and means for heating said substrate; the improvement comprising, in combination:

said cathode having at least two planar faces; an electrically insulated base for removably supporting said cathode in a non-horizontal plane; said plasma region developed between one of said cathode faces and said at least one substrate, whereby a semiconductor layer will be deposited onto said at least one substrate.

7. An apparatus as defined in claim 5 or 6, wherein said base is adapted to support said cathode in a generally vertical plane.

8. An apparatus as defined in claim 5 or 6, wherein said plasma region developing means further includes a plurality of substrates; and said apparatus further includes means for supporting each of said plurality of substrates in a plane generally parallel to the plane of each face of the cathode, whereby a plasma region is developed between each substrate and the adjacent face of said cathode.

9. An apparatus as defined in claim 5 or 6, wherein said cathode is generally planar with an edge thereof adapted to be removably supported by said base; and each of said at least one substrate is supported in a plane generally parallel to the plane of said cathode.

10. An apparatus as defined in claim 9, wherein each of said at least one substrate is supported at a distance of about one inch from said cathode.

11. A apparatus for depositing a semiconductor layer upon a plurality of substrates comprising:
 a housing;
 a vacuum chamber provided by said housing;
 a generally planar cathode operatively disposed within said chamber;
 an electrically insulated base for removably supporting said cathode in a generally vertical plane;
 a plurality of substrates operatively disposed within said chamber; and
 means for developing a plasma region between said cathode and each of said plurality of substrates; said plasma region developing means including: means for supporting each of said substrates in planes generally parallel to the plane of said cathode; means for introducing a semiconductor layer-producing material into said plasma region; a semiconductor layer-producing material; and means for heating said plurality of substrates, whereby a semiconductor layer will be deposited onto each of the substrates.

12. In deposition apparatus wherein a semiconductor layer is deposited upon a plurality of substrates; the apparatus including a housing; a vacuum chamber provided by said housing; a generally planar cathode operatively disposed within said chamber; means for developing a plasma region within said vacuum chamber including a plurality of substrates operatively disposed within said chamber; means for introducing a semiconductor layer-producing material into said plasma region; a semiconductor layer-producing material; and means for heating said plurality of substrates; the improvement comprising, in combination:

an electrically insulated base for removably supporting said cathode in a generally vertical plane; and means for supporting each of said substrates in planes generally parallel to the plane of said cathode, whereby a plasma region is developed between said cathode and each of said substrates for depositing a semiconductor layer onto each of the substrates.

13. An apparatus as defined in claim 11 or 12, wherein each substrate is supported at a distance of about one inch from said cathode.

14. An apparatus as defined in claim 5 or 11, wherein said heating means includes at least one heating element supported in a plane generally parallel to the plane of said cathode.

15. An apparatus as defined in claim 14, wherein said heating means further includes a heat-reflective shield supported in a plane generally parallel to the plane of said cathode, said shield adapted to reflect the heat from said heating means towards each of said substrates.

16. An apparatus as defined in claims 5, 6, 11, or 12, further including means for cyclically expelling each of said substrates from said plasma region.

17. An apparatus as defined in claim 16, wherein said substrate expelling means includes at least one rotatable arm adapted to engage an edge of said substrate, whereby rotation of said arm expels the substrate from said plasma region.

18. In deposition apparatus wherein a plurality of stacked semiconductor layers are deposited upon a substrate; the apparatus including a plurality of adjacent, operatively connected treating chambers; means for developing a plasma region in each of said treating chambers; said plasma region developing means including: a cathode operatively disposed within said chambers; at least one substrate operatively disposed within said chambers; means for introducing a semiconductor layer-producing material into said plasma region; a semiconductor layer-producing material; means for heating said substrate; and means for controlling the flow of said layer-producing material between treating chambers; the improvement comprising, in combination;

means for supporting said cathode in a non-horizontal plane within said housing;

means for supporting said at least one substrate in a plane parallel to the plane of the cathode; and means for automatically introducing said at least one substrate into and expelling said at least one substrate from adjacent treating chambers, whereby an additional semiconductor layer is deposited onto said at least one substrate in each successive treating chamber.

19. An improvement as in claim 18, wherein said cathode is supported in a generally vertical plane.

20. An improvement as in claim 18, wherein said cathode-supporting means includes an electrically insulated base.

21. An improvement as in claim 20, wherein said plasma region developing means further includes two substrates; the second substrate also supported in a plane generally parallel to the plane of said cathode.

22. An improvement as in claim 18, wherein said at least one substrate is defined by a plurality of individual substrate plates.

23. An improvement as in claim 18, wherein said at least one substrate is defined by a continuous web; said substrate web of sufficient length to extend through each of said treating chambers.

24. An improvement as in claim 18, wherein said heating means includes a heat-reflective shield supported in a plane generally parallel to the plane of said at least one substrate, whereby the heat from said heating means is reflected towards said substrate by said shield.

25. A deposition apparatus for depositing a plurality of stacked semiconductor layers upon a plurality of substrates comprising:

a plurality of adjacent, operatively connected treating chambers;

a generally planar cathode within each treating chamber; an electrically insulated base within each treating chambers for removably supporting said cathode in a generally vertical plane;

means for developing a plasma region in each treating chamber; each of said plasma region developing means including: a substrate operatively disposed within said chambers; means for introducing a semiconductor layer-producing material into said plasma region in each treating chamber; semiconductor layer-producing material; means for heating said substrates; means for controlling the flow of said layer-producing material between adjacent treating chambers; means for supporting said substrate in each treating chamber in a plane generally parallel to the plane of said cathode in each treating chamber; and means for automatically introducing said substrate into and expelling said substrate from adjacent treating chambers, whereby an additional semiconductor layer is deposited onto the substrate in each successive treating chamber.

26. An apparatus as defined in claim 25, wherein each heating means includes a heating element supported in a plane generally parallel to the plane of each substrate.

27. An apparatus as defined in claim 25, wherein said heating means includes a heat-reflective shield supported in a plane generally parallel to the plane of each substrate, whereby the heat from said heating means is reflected towards said substrate by said shield.

* * * * *

UNITED STATES PATENT AND TRADEMARK OFFICE
CERTIFICATE OF CORRECTION

PATENT NO. : 4,423,701

DATED : January 3, 1984

INVENTOR(S) : Prem Nath and David A. Gattuso

It is certified that error appears in the above-identified patent and that said Letters Patent are hereby corrected as shown below:

```
Col. 1, line 26, delete "a' first occurrence;
Col. 2, line 24, delete "Stantfor" and insert
                 --Stanford--;
Col. 2, line 43, delete "deletorious" and insert
                 --deleterious--;
Col. 3, line 41, delete "objection" and insert
                 --object--;
Col. 3, line 43, delete "themultiple" and insert
                 --the multiple--;
Col. 6, line 58, delete "explusion" and insert
                 --expulsion--;
Col. 7, line 63, delete "201i" and insert --210i--;
Col. 8, line 33, delete "subsgtrate" and insert
                 --substrate--;
Col. 9, line 37, Claim 1, delete "an amorphous" and
                 insert   --a semiconductor--;
```

Signed and Sealed this

Twentieth Day of November 1984

[SEAL]

Attest:

GERALD J. MOSSINGHOFF

Attesting Officer

Commissioner of Patents and Trademarks